United States Patent [19]
Wells

[11] 3,948,655
[45] Apr. 6, 1976

[54] ELECTROSTATOGRAPHIC PROCESS FOR PREPARING GRAVURE PRINTING MEMBER

[75] Inventor: John B. Wells, Savannah, N.Y.

[73] Assignee: Xerox Corporation, Stamford, Conn.

[22] Filed: Dec. 26, 1973

[21] Appl. No.: 427,592

[52] U.S. Cl. ............... 96/1 R; 96/1 LY; 101/401.1; 427/14; 427/15; 427/16; 427/271
[51] Int. Cl.² .................................. G03G 13/26
[58] Field of Search ........ 96/1 R, 1 LY; 117/37 LE; 101/170, 401.1; 427/15, 16, 271

[56] References Cited
UNITED STATES PATENTS

| | | | |
|---|---|---|---|
| 2,408,144 | 9/1946 | Huebner | 96/1 R X |
| 2,949,848 | 8/1960 | Mott | 101/128.3 |
| 2,949,849 | 8/1960 | Gundlach | 101/128.3 |
| 3,445,226 | 3/1969 | Gundlach et al. | 96/1 R X |
| 3,559,570 | 2/1971 | Martel et al. | 96/1 R X |
| 3,561,358 | 2/1971 | Weigl | 96/1 R X |
| 3,589,289 | 6/1971 | Gosnell et al. | 101/170 X |
| 3,676,215 | 6/1972 | Gundlach | 96/1 LY X |
| 3,687,072 | 8/1972 | Pym | 101/170 X |
| 3,795,530 | 3/1974 | Gundlach | 96/1 LY X |
| 3,801,315 | 4/1974 | Gundlach et al. | 96/1 LY X |
| 3,806,354 | 4/1974 | Amidon et al. | 96/1 LY X |

Primary Examiner—David Klein
Assistant Examiner—John R. Miller
Attorney, Agent, or Firm—James J. Ralabate; James P. O'Sullivan; Donald M. MacKay

[57] ABSTRACT

A process for preparing a gravure printing member is provided in which a multi-celled member, such as a gravure ink roller, containing a liquid but hardenable material below the contact plane of the cells is contacted with an electrostatographic latent image member, the members separated whereby the liquid is removed from the image areas of the celled member by electrostatic attraction and the liquid hardened in the non-image areas of said celled member to provide the printing member.

9 Claims, No Drawings

ELECTROSTATOGRAPHIC PROCESS FOR PREPARING GRAVURE PRINTING MEMBER

BACKGROUND OF THE INVENTION

Modern gravure printing is done principally from images etched in cylinders which are used on web presses and is generally referred to as rotogravure, although similarly etched flat plates can be employed as well. On sheet-fed presses the printing element is generally a thin copper plate wrapped around the cylinder. Preparation of the printing surface is essentially the same for both cylinders and plates.

For monochrome printing by conventional gravure, bichromate-sensitized gelatin coated carbon tissue or transfer film is first contact printed through a continuous-tone positive and then given a second exposure in contact with a screen consisting of transparent lines and opaque square dots, 150 or 175 to the inch. The ratio of line to dot width is usually 1:3. The exposed carbon tissue or transfer film is then moistened and squeegeed into contact with the clean copper surface. Warm water is applied and the paper of the carbon tissue or backing of the film is peeled off. The gelatin which is transferred to the copper surface is then further developed with warm water to produce a gelatin relief resist. Etching is done with 35–43 percent ferric chloride solution. The solution etches the copper to different depths depending on the thickness of the gelatin resist in the different tone areas. The areas corresponding to the screen lines remain unetched and provide "lands" to support a doctor blade in printing. For long runs, the etched cylinder or plate is chromium-plated to resist wear.

For multicolored printing the principal process consists of making both a special halftone positive with a lateral dot formation which is similar to conventional gravure in the shadows but with varying dot sizes and a continuous-tone positive for each color. These are contact-printed successively, in register, onto a sheet of carbon tissue, and the gelatin is transferred to the copper cylinder. Development and etching are essentially the same as for monochrome cylinders. The printing surface thus consists of disconnected ink cells of varying size and depth corresponding to the tone values desired.

While gravure printing is a preferred method of printing by reason of its superior quality, the methods for preparing gravure printing members are relatively expensive, time consuming and thus generally uneconomical for short runs. In addition, the gravure plates can be used only for one image and the image cannot be removed and the plate reused. While gravure cylinders can have the old image stripped off and the cylinder replated for reuse, this is an expensive and time consuming process. Thus it would be desirable if a process could be developed for rapidly and inexpensively forming gravure printing members particularly well suited for short runs.

DESCRIPTION OF THE INVENTION

It has now been discovered that gravure printing members can be prepared inexpensively and rapidly to obviate the two disadvantages of the previous methods. More particularly, a camera speed process for preparing gravure printing members is provided. The process comprises contacting a member having a latent electrostatographic image with a gravure member having a multiplicity of depressions such as a gravure inking roller, said gravure member having in said depressions below the contact plane, a liquid but hardenable material which is impervious to a printing fluid and not dissolvable by said printing fluid and which can be removed from the gravure member by the electrostatic attraction. Then the gravure member and the electrostatographic latent image member are separated in the absence of light whereby the liquid is caused to be removed from the depressions in the image areas by electrostatic attraction. The liquid remaining on the gravure member is then hardened to form an imaged gravure printing member consisting of ink receptive voids in an imagewise configuration. The voids or depressions are referred to in the art at "valleys" or "cells".

The conventional ink applicator gravure rolls can be employed as the gravure member to manufacture the gravure printing member of the invention. These rolls which are available commercially can be pocketed or grooved. Typical rolls have from 180–200 cells per linear inch, although they may have as few as 120 and as many as 220. The pitch or distance between lands is approximately 5.5 mils, and the cell depth is about 4 mils. Commercial sources include Consolidated Engraving, Modern Engraving Machine Company and Pamarco. The roll can be made of conventional materials such as steel, brass, stainless steel, copper, zinc or plastic and the cells imparted to the roll by the conventional methods. For example, a roll can be produced by photofabrication. By this method, a brass roll is coated with a layer of photoresist and a lined transparency stretched across the roll. The photoresist is then exposed such as with a carbon arc, set approximately 4 feet away and focused through a 0.1 inch slot in a mask with an exposure time of about 4 minutes. The photoresist can then be developed with the appropriate materials suggested by the manufacturer of the photoresist material, and etched with a conventional material such as ferric chloride.

Where long life is not required, the gravure member can be made of plastic such as polyester (Mylar), polyacetate, polycarbonate, polysulfone and the like. Because the plastic is easily deformed, the cells can be pressed into a flexible film of the plastic. The plastic film can then be adhered to a plate or drum.

Liquid materials suitable for filling the gravure member include waxes, and a variety of natural polymerizable monomers and synthetic polymers which are of a low viscosity or can be made of a low viscosity. It is only necessary that the material be sufficiently liquid when applied to the gravure member such that it fills the cells or grooves, that the material can be hardened such that it is impervious to the printing fluid employed and not dissolvable by the printing fluid, and that the liquid can be removed from the cells or grooves by electrostatic attraction. Thus it can be appreciated that a large number of materials can be employed.

The liquid materials which can be employed to fill the gravure member include materials which are hardenable at ambient temperature, or elevated temperature and which can be hardened or cured by cooling, air, or some form of radient energy such as heat and ultraviolet light. Photo-hardenable polymers which can be cured by light are particularly preferred as it is not necessary to adjust the temperature of the gravure member. The particular liquid employed will depend on the desired life of the printing master, ths substrate to which it is to be adhered and other variables such as cost and availability.

Waxes can be employed which are solid at room temperature and can be made liquid at elevated temperature. Representative examples include: beeswax, carnauba wax, parafin waxes and the like. Preferred waxes are those melting below 100° C and most preferably below 60° C.

Liquid polymers which can be employed to fill the gravure member include low viscosity thermoplastics, thermosetting plastics thermosetting resins and photopolymers. Exemplary of suitable thermoplastics are polyethylene, polypropylene, ethylene-vinyl acetate copolymers, propylene-modified polyethylene, acetals, acrylics, acrylonitrile-butadiene-styrene (ABS), polystyrene, cellulosics, shellac, chlorinated polyether, fluorochemicals, polyamides (nylons), polyimides, phenoxies, and vinyls. Exemplary of suitable thermosetting plastics are aminoplasts (urea-formaldehyde, melamine-formaldehyde), phenolics, epoxies, diphenyl oxide, polyurethanes, polyesters, diallyl phthalates, and silicones. Exemplary of thermosetting resins are vinyl, acrylic, alkyd, polyurethane, silicone, phenolic, and epoxy resins.

Polymerizable monomers can also be employed to fill the gravure member. For example, monomers such as methyl, ethyl and propyl methacrylate, styrene and pivalolactone can be employed with an initiator. Initiators which can be employed to polymerize the aforesaid monomers (other than pivalolactone) include conventional materials such as for example, benzoyl peroxide, and azo-bis(isobutyronitrile). An initiator for pivalolactone is triphenyl phosphine. A number of materials can be employed and it is only necessary that the initiator or catalyst be soluble in the monomer or very finely dispersed.

Exemplary of suitable photopolymers are the cinnamic resins of polyvinyl alcohol, cellulose, starch and the epoxy resin of epichlorohydrin and 4,4'-isopropylidenediphenol. Polymethacrylate and polyamide coatings can also be employed when mixed with photosensitive polymerizable materials.

The gravure member can be filled by conventional means. For example, it may be dipped in the liquid material or draw bar coated.

The thermoplastic materials and waxes which are solid at ambient temperature can be converted to a low viscosity by heat so as to render them electrostatically removable. The thermosetting polymers are liquid at ambient temperature or below their curing temperature and the photopolymers are liquid until cured such as by ultraviolet light. Materials employed should not contain any appreciable amount of solvent so that evaporation does not result in ink accepting pockets in the non-imaged areas.

If desired, a gravure member can be prepared by filling the cells of the gravure member at elevated temperature with a wax or thermoplastic material and then allowing the material to harden by cooling. When it is desired to image the gravure member, the material can be softened by heat to fluidize the material so as to permit removal in the image areas by electrostatic attraction.

In order to prevent the removal of the fluid from the gravure member in the non-imaged areas because the physical contact when the gravure member and imaging member are contacted, it is necessary that the gravure member be doctored, after the cells are filled and before imaging, with a flexible doctor blade such as soft rubber, nylon or polyurethane. In this manner, the fluid is removed from the lands, and the top of the cells below the contact plane so that when the gravure member is contacted with the image member, the fluid is removed from the gravure member only in cells corresponding to the imaged areas by electrostatic attraction and not from the nonimaged areas by physical contact. After imaging, hardening of the material in the nonimaged areas and inking of the resultant gravure printing member, it is again necessary to use a flexible doctor blade in order to remove the ink below the contact plane. This is necessary because the gravure roll is celled both in the imaged and non-imaged areas although the image depressions are deeper. Accordingly, if a flexible doctor blade were not employed the gravure member would print from both image and non-image areas. To print from the gravure printing member, which consists of lands and valleys both in the image and non-image areas but wherein the valleys are deeper in the image areas, it is necessary to doctor with a flexible doctor blade to remove the ink from the shallow valleys in the nonimage areas prior to transfer of the inked image to a receiving member. A preferred embodiment is to charge either the gravure roller, receiving member, or both in order to transfer the ink by uniform electrostatic attraction. When the valleys of the imaged gravure printing member are shallow and/or the receiving member made of a resilient material such as a deformable paper, the ink can be transferred by merely pressing the receiver member into the inked valleys of the gravure printing member.

The electrostatographic image can be formed by conventional means such as xerography. By this method the image is formed on a photoreceptor imaging member such as a zinc oxide paper master or a selenium drum. Then the electrostatographic latent image on the imaged member is contacted to the gravure member in the absence of light and the two members quickly separated. The contact and separation of the two members causes the liquid to be removed from the gravure member in areas corresponding to the charged areas. The liquid remaining on the gravure member can then be hardened by cooling heat, air, ultraviolet light or the like, the particular treatment depending on the material employed as the liquid. Images of either positive or negative sense can be formed.

In addition to the photoreceptors mentioned, other conventional photoreceptors can be employed. Typical photoreceptors include inorganic materials such as cadmium sulfide, cadmium sulfoselenide, mercuric sulfide, lead oxide, lead sulfide, cadmium selenide and mixtures thereof dispersed in binder or as homogeneous layers. Typical organic photoreceptors include pigments such as quinacridones, carboxanilides, triazines and the like. The photoreceptor containing the electrostatographic latent image can be contacted directly with the gravure member or the electrostatographic latent image can be first transferred to a dielectric material such as Mylar polyester and the dielectric material contacted with the gravure member. Further, the electrostatographic image can be formed without the use of a photoconductor by applying a metal stencil over a dielectric member such as polyester film and the surface charged according to the pattern in the stencil. The charged film is contacted to the gravure member, separated and the fluid hardened in the nonimage areas as described above.

When it is desired to make a positive image from an image which is negative in sense, one may charge and expose a photoconductor to activating electromagnetic radiation to provide a negative image and bias (charge) the gravure member to a potential which is approximately the same as those areas of the image which are of the higher potential so that when the two members are contacted and separated, the non-image areas are developed to provide a gravure member with an image which is positive in sense.

Typical inks and printing equipment can be employed with the gravure printing member of the invention. Typical inks include inks of the rubber or oleophilic type having the vehicle component for the ink pigments derived from various oleophilic materials such as aromatic and aliphatic hydrocarbons, dyring oil varnishes, lacquers and solvent-type resins. An ink or printing fluid should be selected which is compatible with the coated gravure member.

The liquid but hardenable material can be removed from the gravure member and the ink removed from the gravure printing member by capillary action even if the viscosity is high when the members are contacted with the imaging member and receiver member, respectively, for a relatively long time. It is preferred, however, that the liquid materials have a sufficiently low viscosity and resistivity that they can be quickly removed by use of an electrostatic field. Nearly all of the materials are sufficiently conductive as it is only necessary to have a resistivity of less than $10^{13}$ ohm/cm and for the few materials which are below this conductivity, a common electrolyte such as salt can be added. Likewise, the viscosity is not a critical parameter, it only being necessary for optimum results that the liquid material and ink can be selectively removed by an electrostatic field.

The following examples will serve to illustrate the invention. All parts and percentages in said examples and elsewhere in the specification and claims are by weight unless otherwise specified.

EXAMPLE I

A steel 4¾ inch diameter quadragravure roller (Pamarco 200) having lands and valleys of 200 lines per inch was heated to above 52° by means of a Will Scientific Co. heat gun and then coated with a liquid parafin wax, m.p. 50°–52° C, (Bolar Chemical No. 1413) and the wax doctored off by means of a plastic blade to remove the wax below the contact plane. A zinc oxide photoreceptive paper (Bruning 2000) was charged with negative corona and exposed to a silver halide positive transparency producing an electrostatographic latent image positive in sense. The charged paper was contacted by hand to the gravure roller in the dark and then separated. In room light a wax positive image was found on the roller consisting of empty pockets and a corresponding wax image was observed on the photoreceptor. The gravure roller was allowed to harden an ambient temperature for 24 hours and then ink was applied by liquid dropper and the excess ink doctored out of the valleys with a plastic blade. A zinc oxide photoreceptor paper sheet (Bruning 2000) was uniformly charged with negative corona and contacted with the roller and the separated. The reproduction of the original image was observed on the zinc oxide paper. The above inking, doctoring and ink transfer steps were repeated many times with the original image being reproduced on the zinc oxide coated paper.

EXAMPLE II

The general procedure of Example I is repeated with the following exceptions. A polymerizable monomer (43 grams of dicosyl acrylate) is combined at room temperature with 0.16 grams of 2,2$^r$-azo bis(2-methylpropionitrile) dissolved in 10 cc of methylene chloride and the mixture maintained at room temperature to evaporate the methylene chloride. This mixture is then heated to 50° to 60° C and coated on a Pamarco No. 55Q steel quadragravure roller. The roll is doctored, contacted in the dark at 50° C with a charged and imaged zinc oxide paper and separated from the paper. In room light an image pattern consisting of depleted cells is observed on the roller. The roller is heated to 90° C to polymerize the monomer in the non-image areas and the roller allowed to cool to room temperature. Ink is then applied, followed by doctoring and contact of the roller with paper sheets to transfer the inked image.

EXAMPLE III

A steel gravure member is filled with a wax by the procedure of Example I. A zinc oxide photoreceptive paper is uniformly charged with negative corona and exposed to a silver halide image, negative in sense. The gravure member is biased negative to approximately the same charge potential as those areas of the photoreceptive paper of the higher potential. The gravure member and paper are pressed together by a hand roller in the dark and separated. In room light, a positive image is seen on the gravure member. The gravure member is allowed to cool to room temperature whereupon the wax hardens. After cooling, the gravure member is inked, squeezed and the images transferred to positive uniformly charged paper, thus producing images positive in sense from a negative source.

Having described the present invention with reference to these specific embodiments, it is to be understood that numerous variations can be made without departing from the spirit of the invention and it is intended to include such reasonable variations and equivalents within the scope.

What is claimed is:

1. A method for preparing a gravure printing member comprising contacting, in the absence of light, a first member having latent electrostatographic charged image areas with a second member having a multiplicity of cells and containing in said cells below the contact plane, a liquid but hardenable material which is impervious to a printing fluid and not dissolvable by said printing fluid and which has a viscosity sufficiently low to permit removal by electrostatic attraction and a conductivity less than $10^{13}$ ohm/cm, separating the members whereby the liquid is removed from the cells by electrostatic attraction in the charged areas of the image and hardening the liquid remaining in the cells of said second member to form an imaged gravure printing member.

2. The method of claim 1 wherein the image on the image member is xerographically formed by charging a photoconductive layer and exposing it to imagewise light to form an electrostatographic latent image.

3. The method of claim 1 wherein the imaged member comprises zinc oxide photoreceptive paper.

4. The method of claim 1 wherein the gravure printing member comprises lands and valleys in the imaged and non-imaged areas wherein there are from 120 to 220 valleys per linear inch.

5. The method of claim 1 wherein the gravure printing member comprises lands and valleys in the imaged and non-imaged areas wherein there are from 180 to 200 valleys per linear inch.

6. The method of claim 1 wherein the gravure printing member is cylindrical in shape.

7. The method of claim 1 wherein the printing member comprises lands and valleys both in the imaged and non-imaged areas but wherein the valleys are deeper in the imaged areas.

8. The method of claim 1 wherein the printing member comprises lands and valleys both in the imaged and non-imaged areas wherein the valleys in the non-imaged areas are sufficiently shallow that a flexible doctor blade can remove substantially all ink deposited therein and the valleys in the imaged areas are sufficiently deep that a flexible doctor blade cannot remove substantially all of the ink deposited therein.

9. A method for preparing a gravure printing member comprising contacting, in the absence of light, a first member having latent electrostatographic charged image areas with a second member having a multiplicity of cells and containing in said cells below the contact plane, a liquid material hardenable at ambient or elevated temperature which is impervious to a printing fluid and not dissolvable by said printing fluid and which has a viscosity and conductivity sufficiently low to permit removal by electrostatic attraction said conductivity being less than $10^{13}$ ohm/cm, separating the members whereby the liquid is removed from the cells by electrostatic attraction in the charged areas of the image and hardening the liquid remaining in the cells of said second member to form an imaged gravure printing member.

* * * * *

UNITED STATES PATENT AND TRADEMARK OFFICE
CERTIFICATE OF CORRECTION

PATENT NO. : 3,948,655

DATED : April 16, 1976

INVENTOR(S) : JOHN B. WELLS

It is certified that error appears in the above—identified patent and that said Letters Patent are hereby corrected as shown below:

Col. 2, line 63, delete "radient" and insert -- radiant --.

Col. 2, line 68, delete "ths" and insert -- the --.

Col. 5, line 65, delete "the" and insert -- then --.

Signed and Sealed this twenty-ninth Day of June 1976

[SEAL]

Attest:

RUTH C. MASON
Attesting Officer

C. MARSHALL DANN
Commissioner of Patents and Trademarks